(12) United States Patent
Froman

(10) Patent No.: US 11,255,923 B2
(45) Date of Patent: Feb. 22, 2022

(54) HANDHELD ELECTRICAL BONDING TEST SYSTEM

(71) Applicant: Textron Innovations Inc., Providence, RI (US)

(72) Inventor: Gary Froman, Fort Worth, TX (US)

(73) Assignee: TEXTRON INNOVATIONS INC., Providence, RI (US)

( * ) Notice: Subject to any disclaimer, the term of this patent is extended or adjusted under 35 U.S.C. 154(b) by 254 days.

(21) Appl. No.: 16/533,139

(22) Filed: Aug. 6, 2019

(65) Prior Publication Data
US 2021/0041490 A1 Feb. 11, 2021

(51) Int. Cl.
| | |
|---|---|
| *G01R 31/66* | (2020.01) |
| *H03F 3/45* | (2006.01) |
| *H03K 5/24* | (2006.01) |
| *B64F 5/60* | (2017.01) |
| *H03K 3/037* | (2006.01) |

(52) U.S. Cl.
CPC .............. *G01R 31/66* (2020.01); *B64F 5/60* (2017.01); *H03F 3/45475* (2013.01); *H03K 5/24* (2013.01); *H03F 2200/129* (2013.01); *H03F 2203/45116* (2013.01); *H03F 2203/45528* (2013.01); *H03F 2203/45601* (2013.01); *H03K 3/037* (2013.01)

(58) Field of Classification Search
CPC ........ G01R 31/66; G01R 31/67; G01R 31/50; H03F 3/45475; H03F 2203/45116; H03F 2203/45528; H03F 2203/45601; H03K 5/24; H03K 3/037; B64F 5/60
See application file for complete search history.

(56) References Cited

U.S. PATENT DOCUMENTS 9,166,531 B2 * 10/2015 Iijima .................... H03F 3/193

* cited by examiner

*Primary Examiner* — Jung Kim
(74) *Attorney, Agent, or Firm* — Slater Matsil, LLP

(57) ABSTRACT

An electrical bonding test device, including a test system circuit configured to generate a current pulse for ground bonding testing of subject units, a first test system connector configured to provide an electrical connection between a first unit connector shell of a first unit of the subject units and the test system circuit and to pass the current pulse to the first unit connector shell during the ground bonding testing, and a second test system connector configured to provide an electrical connection between a second unit connector shell of a second unit of the subject units and a first node of the test system circuit. The test system circuit is further configured to provide an indication indicating whether a bonding path through the subject units is a conductive path having a resistance below a resistance threshold.

7 Claims, 5 Drawing Sheets

HANDHELD ELECTRICAL BONDING TEST SYSTEM

TECHNICAL FIELD

The present invention relates generally to a system and method for testing bonding of electrical components, and, in particular embodiments, to a system and method for verifying proper grounding of mounted electrical components.

BACKGROUND

Modern aircraft such as fixed wing aircraft, rotorcraft, tiltrotor aircraft, and the like require numerous electronic components for navigation, aircraft management, or other flight control functions. Avionics units and computer based control systems for aircraft require proper electrical bonding to an aircraft system ground in order to function properly. Radiated fields and lightning transients can disrupt the operation of computers because the electrical noise couples onto the sensitive signals inside the electronic units or computers. Additionally, filter pin connectors on the units and transient suppressors which help to filter out the noise in the units require a discharge path to aircraft ground. Typically, expensive ground support equipment is used to check the avionic units for bonding when they are first installed, but is seldom used as a periodic check for good aircraft bonding. Additionally, operator error caused by cumbersome probes and lack of maintainer experience is common.

SUMMARY

An embodiment device, including a current pulse source, a first connector having a first connector shell connected to the current pulse source, a second connector having a second connector shell, an amplifier electrically connected to the first connector shell and the second connector shell, and a comparator connected to an output of the amplifier.

An embodiment method includes providing, by a bonding test system, a current pulse through a first connector shell of a first test system connector to a second connector shell of a second test system connector, determining, during the current pulse, a differential voltage between a first voltage at the first connector shell and a second voltage the second connector shell, generating a differential voltage signal indicating the differential voltage, and providing at least one of a pass indication or a fail indication according to the differential voltage signal.

An embodiment device includes a test system circuit configured to generate a current pulse for ground bonding testing of subject units, a first test system connector configured to provide an electrical connection between a first unit connector shell of a first unit of the subject units and the test system circuit and to pass the current pulse to the first unit connector shell during the ground bonding testing, and a second test system connector configured to provide an electrical connection between a second unit connector shell of a second unit of the subject units and a first node of the test system circuit, where the test system circuit is configured to generate a comparison signal according to a relation between a differential voltage and a reference voltage, where the differential voltage is a difference, during the ground bonding testing, in a first voltage at the first test system connector and a second voltage at the first node caused by the current pulse, and where the test system circuit is further configured to provide a test output indication according to the comparison signal, the test output indication indicating whether a bonding path through the subject units is a conductive path having a resistance below a resistance threshold.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

Figure 1:
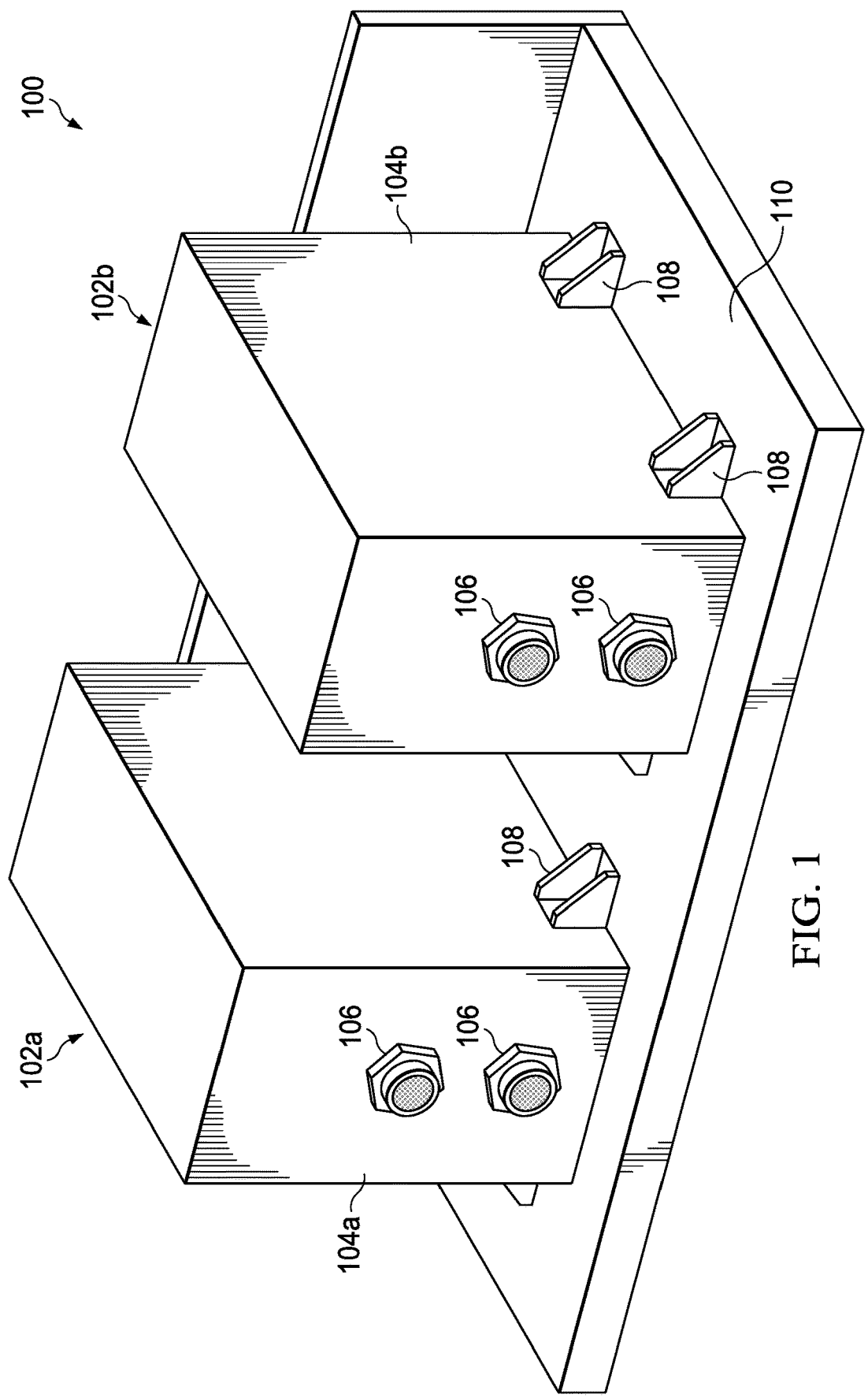
FIG. 1 illustrates units mounted on a conductive shelf according to some embodiments.

Electrical units for computer system, avionics, navigation, flights controls and like for aircraft and other vehicles typically have grounded components bonded to an aircraft group through a common connection to a conductive rack or shelf, which is in turn electrically connected to a system ground. Electromagnetic interference (EMI) and transients from lightning can disrupt microprocessor functions and cause a computer failure if proper ground bonding is not attained. EMI and lightning transients must be filtered and discharged to the aircraft ground. Bonding provides a discharge path for filtered connectors, lightning transient suppressors, cable shields, avionics chassis or Faraday cages, and the like. A target impedance from the avionics units to the aircraft ground may typically be in the range of about 2.5 milliohms, which ensures that a low resistance conductive path exists between a grounded element of the avionics unit and the system ground.

Embodiments described herein provide for a handheld bonding test system that tests a conductive path between two electrical units, as well as the conductive shelf between the two units, to verify that an acceptable electrical path exists for the grounded elements of the units. The handheld bonding tester connects to connectors on units and tests the bonding path between grounded elements of connectors of the units. Using grounded elements of the connectors of the units may avoid requiring removal of paint on the avionics shelf and on the avionics units. Additionally, using grounded connector shells to test the bonding through the units without interacting with the pins of the connectors, permits avionics unit grounding or bonding testing without requiring specific configuration or design of the avionics. Thus, the bonding tester may be used with legacy avionics units.

The bonding tester includes connections to connector shells on two avionics units on a common conductive shelf, eliminating paint stripping and operator error in the bonding probe positioning. The bonding test system may connect to two avionics units to verify that grounded elements from both avionics units have a connection to each other through the conductive shelf. This avoids requiring a test system contact the conductive shelf itself, or requiring a foot-to-shelf check, which require that that the foot and shelf test points be free of paint for accurate electrical testing. Such test requirements frequently results in operator error. The bonding tester indicates pass or fail to the maintainer eliminating interpretation of the readings, improve system reliability and readiness.

In some embodiments, bonding test system uses a capacitive discharge to provide the large amount of current required to measure the 2.5 milliohms bonding resistance. The operator actuates the discharge while the test system monitors the voltage difference between the aircraft ground and the avionics chassis. A high impedance bonding connection to the aircraft is measured as a high voltage to a differential amplifier of the bonding tester and a test output indication, such as a pass or fail indication, is displayed. A high bonding resistance can be reported to maintenance personnel for correction of the improper electrical ground.

FIG. 1 illustrates units 102a, 102b mounted on a conductive shelf 110 according to some embodiments. An avionics system 100 may include one or more units 102a, 102b, and a conductive shelf 110, bracket, bulkhead, firewall, or the like, which is connected to a system ground, such as an aircraft, system, or vehicle ground. The units 102a, 102b may have a conductive chassis 104A, 104b. The chassis 104a, 104b may be connected by a foot 108, bracket, or other connective connection that provides a conductive electrical connection to the conductive shelf 110 to ground the chassis 104a, 104b and provide EMI shielding to circuits within the respective units 102a, 102b. The units 102a, 102b may have connectors 106 that are configured to connect cables or the like to provide power, communications, or the like to the unit circuits. In some embodiments, the unit connectors 106 have conductive elements that are grounded through the chassis 104a, 104b to provide grounding for connected cables. Additionally, in some embodiments, the connectors may have filters, shields, or the like that may be grounded to through the chassis 104a, 104b.

Figure 2:
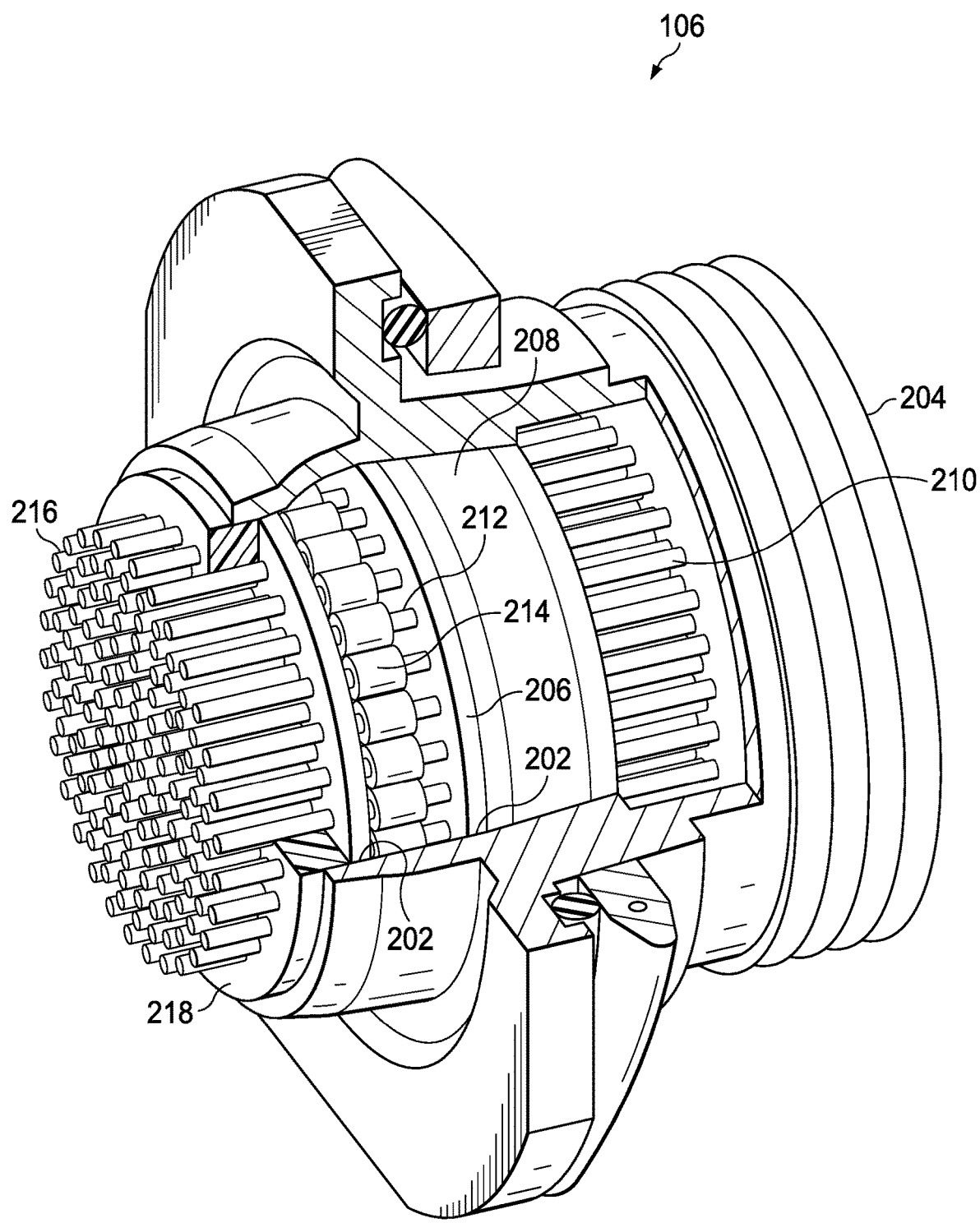
FIG. 2 is a cutaway diagram of a unit connector according to some embodiments.

FIG. 2 is a cutaway diagram of a unit connector 106 according to some embodiments. In some embodiments, the connector 106 has a conductive connector shell 204 though which grounding may be provided. The connector shell 204 may have one or more grounding surfaces 202 for grounding planar array capacitor filter elements or surface mount technology (SMT) components 212 mounted on a printed circuit board 206. For example, in some embodiments, the connector 106 may house capacitive filter elements that are grounded to the connector shell 204 to provide high frequency noise attenuation. In other embodiments, the connector 106 may house other types of filter elements such as inductors, capacitor-inductor networks, or the like, that may be grounded to the connector shell 204 when required.

The connector 106 may have one or more wire connections 216 such as solder cups or the like that are provided for attaching signal wiring. The wire connections 216 may be potted or cast in an epoxy cast 218 or other insulating material, such as porcelain, rubber, or the like, to keep the wire connections 216 spaced apart and separated from the grounding surfaces 202. The wire connections 216 may extend through the epoxy cast 218 and connect to the capacitive filter elements or to the SMT components 212 by chokes 214 such as ferrite beads or other components. Each filter element or SMT component 212 may be attached to a contact 210 such as a pin in male connectors, or a socket in a female connector. The contacts 210 may be insulated from the grounding surfaces 202 of the connector shell 204 by a connector insulator 208.

In some embodiments, the connector shell 204 is electrically connected to the chassis of a unit, or is otherwise bonded to the conductive shelf so that the connector shell 204 is grounded to a system ground. Additionally, the connector shell 204 may provide a ground for cable sheathing that provides EMI protection for cables or the like. This grounding provided through the connector shell 204 may be advantageously used to test the resistance of a bonding path that is an electrical connection through the connector shell 204 to the conductive shelf, including intervening components such as the unit chassis and connections between the connector shell 204, chassis and conductive shelf. A large voltage drop across the bonding path indicates a high resistance, or poor electrical connection, within the bonding path. Thus, a bonding path having a resistance higher than a resistance threshold, may fail a bonding test. In some embodiments, the resistance threshold may be 10 milliohms, and in some embodiments, may be 2.5 milliohms.

When a current is passed through the connector shell 204, that current should be detectable at the connector shell 204 of another unit since all connector shells 204 and intervening components should be electrically connected to a common ground when properly bonded. Thus, in a system to be tested, a connection between a connector shell 204 of a first unit to a unit chassis, to a shelf to a chassis of a second unit, to the connector shell 204 of the second unit, can be verified. Since the conductive shelf is presumed to be grounded since it is part of the system structure, both units under test can be verified to be properly grounded if they connect to the conductive shelf.

Figure 3:
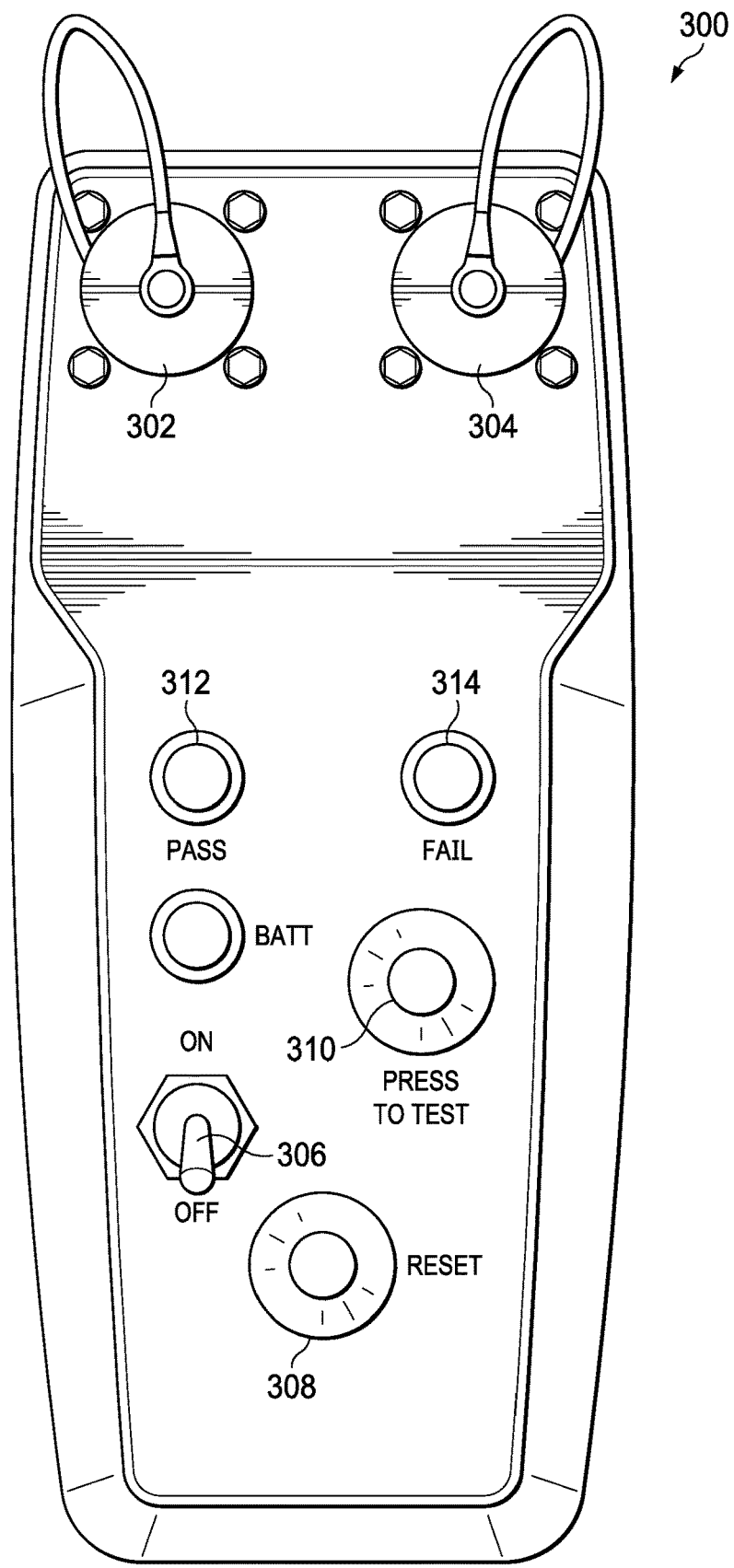
FIG. 3 is a bonding test system according to some embodiments.

FIG. 3 is a bonding test system 300 device according to some embodiments. The test system 300 may be a portable, handheld unit, but may also be implemented in a multipurpose test system, as a system built into one or more avionics units, as a general purpose computer with appropriate sensors and circuitry, or the like. The test system 300 may have two or more test system connectors 302, 304, that may have connector shells sized for test cables that connect to connectors on target units. The test system connectors 302, 304 provide easy hookup interfaces through the connector shell while avoiding passing current or a signal though the connector pins.

A power switch 306 may be utilized to turn the test system 300 off or on. The test system 300 may further have indicators 312, 314 such as a pass indicator 312 and a fail indicator 314 that indicate to an operator whether a connection between the test system connectors 302, 304 has a sufficiently low resistance indicating that a proper ground path or electrical bond exists between unit connectors and intervening components. In some embodiments, the indicators 312, 314 may be lights, audible alarms, or other visual or audible indications of whether the bonding check has passed or failed. The test system 300 may include a test switch 310 that initiates the bonding check, and a reset button 308 may be provided to reset the bonding test system 300.

Figure 4:
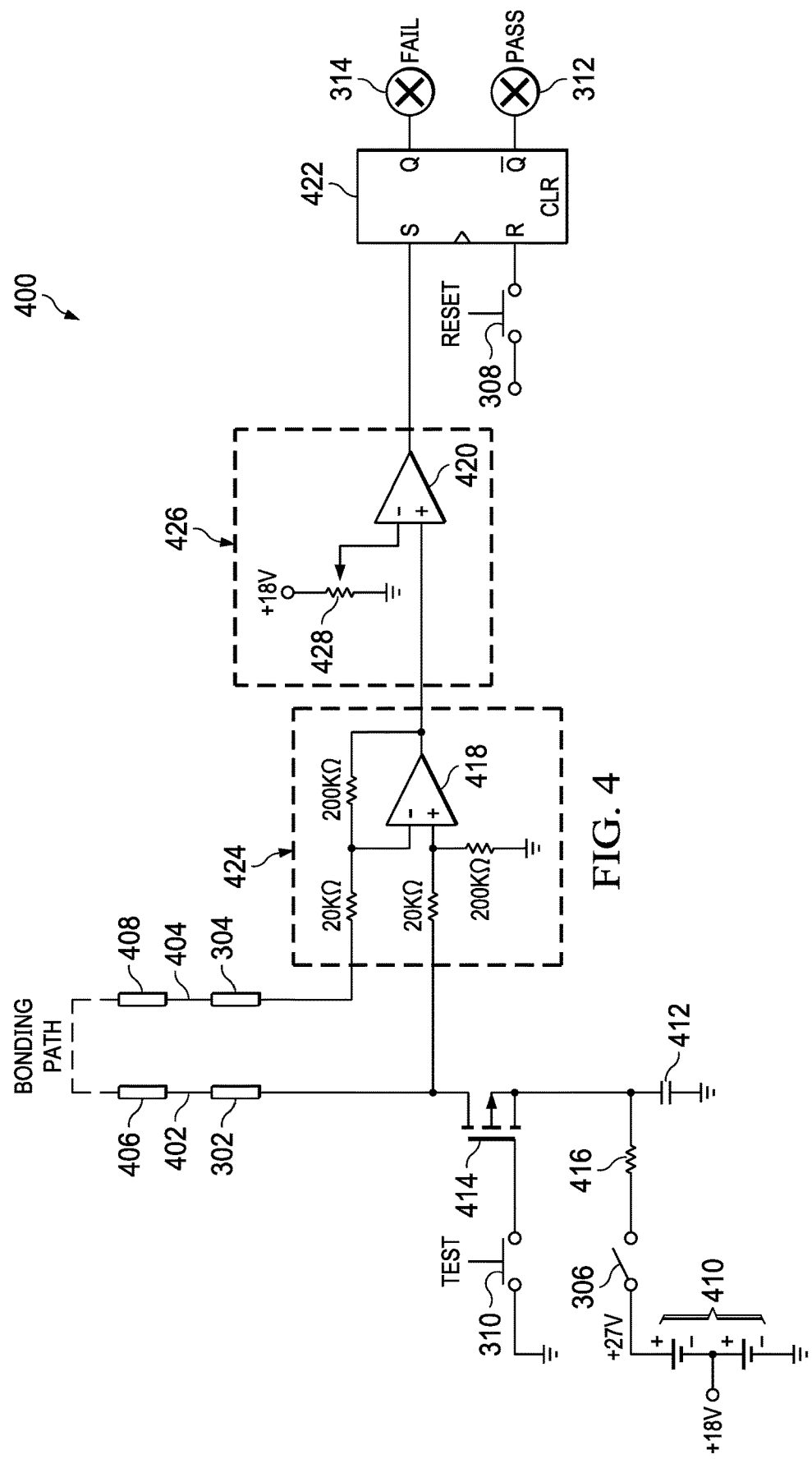
FIG. 4 is a circuit diagram for a bonding test system according to some embodiments.

FIG. 4 is a circuit diagram illustrating a bonding test system circuit 400 according to some embodiments. The bonding test system may be a portable unit with one or more power sources 410 such as batteries, or may have another power source such as a power converter, alternating current (AC) or direct current (DC) power source, or the like. The power switch 306 may be disposed between the power source 410 and the remainder of the circuit. In some embodiments, a current limiting resistor 416 may be connected between the power switch 306 and a node between a capacitor 412 and switching transistor 414. The capacitor 412 may provide current for a high current pulse sent through the bonding path for testing the ground bonding of subject units. The switching transistor 414 may have a gate connected to a test switch 310, which pulls the gate to ground when activated and turns on the conductive channel of the switching transistor 414 between the capacitor and the test system connectors 302, 304 to activate the bonding test system, permitting the switching transistor 414 to act as a high current switch and provide current discharge from the capacitor 412 to the bonding path.

The switching transistor 414 may provide current to a bonding path so that the current passes from a first test system connector 302, through a first test system cable 402, and through a first connector shell 406 of the first test system cable 402 to the bonding path. The current then passes through the bonding path, and through a second connector shell 408 of a second test system cable 404, through the second test system cable 404 to a second test system connector 304 of the test system. In some embodiments, the test system uses a differential amplifier 424 to measure the voltage difference between the second test system connector 304 and the first test system connector 302 during the current pulse. This differential voltage indicates the resistance in the bonding path. In some embodiments, the differential amplifier 424 is implemented using an operational amplifier 418 with a biasing resistor arrangement.

The differential amplifier 424 compares the voltages at the test system connectors 302, 304 and outputs a differential voltage signal indicating the differential voltage associated with a voltage drop across the bonding path. When a component or connection in the bonding path is improperly bonded or improperly connected, the bonding path will have a relatively high resistance, and the differential voltage will be high. When all components in the bonding path are properly bonded, the connections between each component have a low resistance, and the differential voltage will be negligible.

The test system further has a comparator 426 that compares the differential voltage signal to a reference voltage and generates a comparison signal. In some embodiments, if the differential voltage exceeds the reference voltage, the comparison signal is generated as a positive voltage pulse, and if the differential voltage is less than the reference voltage, the comparison signal is generated as a low, negative or zero voltage pulse. In some embodiments, the comparator 426 is an analog comparator implemented using an operational amplifier 420. The reference voltage may be provided by a reference voltage element 428 such as an adjustable resistive element which in some embodiments, may be a potentiometer, variable resistor, or the like, to adjust the threshold voltage to, for example, accommodate for variances in resistor values or component tolerances in the circuit 400. In other embodiments, the reference voltage may be provided by a voltage source, fixed value resistor, or the like.

The signal that is output from the comparator 426 may be latched or otherwise maintained to ensure that a pass or fail indication that is being presented to a user is shown until the user resets the device. In some embodiments, the output from the comparator 426 is connected to a storage element 422 such as a flip flop latch or the like. In an embodiment where the storage element 422 is a flip flop latch, the output from the comparator 426 may be connected to a set port of the flip flop latch, and the reset button 308 may be connected to a reset port of the flip flop. The reset button 308 may connect the reset port of the flip to a non-ground voltage when activated, resetting the storage element 422.

The storage element 422 outputs a pass signal at the complementary output to illuminate the pass indicator light 312 when the voltage drop across the bonding path is sufficiently low. When the voltage differential between the test system connectors 302, 304 is relatively low, and the differential amplifier outputs a low value output signal that is lower than the reference voltage, causing the comparator 426 to indicate that the reference voltage is larger than the differential voltage, and output a low signal to the storage element 422, which provides a signal at the complementary output that causes the pass indicator light 312 to illuminate.

The storage element 422 may also output a fail signal to the normal output to illuminate the fail indicator light 314 when the voltage drop across the bonding pass exceeds a threshold. When the voltage differential between the test system connectors 302, 304 is large, the differential amplifier 424 outputs a high value output signal that exceeds the reference voltage, causing the comparator to indicate that the differential voltage is larger than reference signal and output a high signal to the storage element 422, which provides a signal at the normal output that cause the fail indicator 314 to illuminate.

Figure 5:
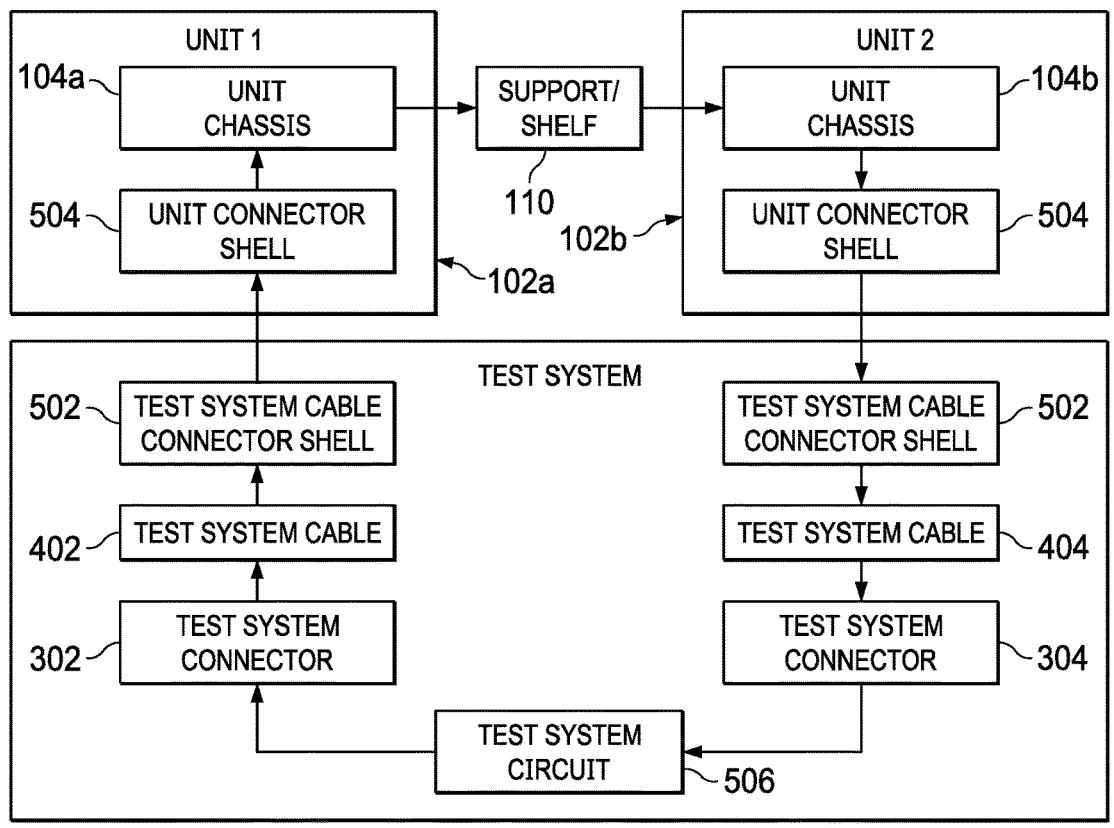
FIG. 5 is a diagram illustrating testing of unit bonding according to some embodiments.

FIG. 5 is a diagram illustrating testing of unit bonding according to some embodiments. In some embodiments, bonding for a first unit 102a and second unit 102b is performed by connecting the test system 300 to the first unit 102a and second unit 102b, and passing a current through the first unit 102a and second unit 102b so that a voltage drop across the first unit 102a and second unit 102b may be measured.

The test system 300 includes a test system circuit 506 that is electrically connected to the test system connector, which is, in turn, connected to a first test system cable 402. The test system cables 402, 404 provide an electrical connection to respective test system cable connector shells 502. The test system cable connector shells 502 may be electrically connected to a connection in the body of the test system cable 402, 404, through a sheath on the test system cable 402, or the like. A first test system cable connector shell 502 electrically contacts the unit connector shell 504 of the first unit 102a to provide an electrical connection. When the test system 300 is energized by, for example, pressing the test switch, the test system 300 circuit passes a current though a first test system connector 302, through the test system cable 402 and test system cable connector shell 502 to the first unit 102a.

The first unit 102a, conductive shelf 110 and second unit 102b form a bonding path between the test system cable connector shells 502. The quality of the electrical ground bonding between the first unit 102a and the conductive shelf 110 and between the conductive shelf 110 and the second unit 102b is indicated by the voltage drop across the test system cable connector shells 502 or the test system connectors 302, 304.

When the test system circuit 506 provides a test pulse through the bonding path, the current passes from the test system cable connector shell 502 of a first test system cable 402 through the unit connector shell 504 of the first unit 102a, through the unit chassis 104a to the conductive shelf 110. The current then passes from the conductive shelf 110 to the second unit chassis 104b through the unit connector shell 504 of the second unit 102b back to the test system 300 though a second test system cable connector shell 502 of a second test system cable 404, the second test system cable 404 and the second test system connector 304. The test system circuit 506 may then measure a voltage drop across the test system connectors 302, 304 to determine the resistance of the bonding path.

Figure 6:
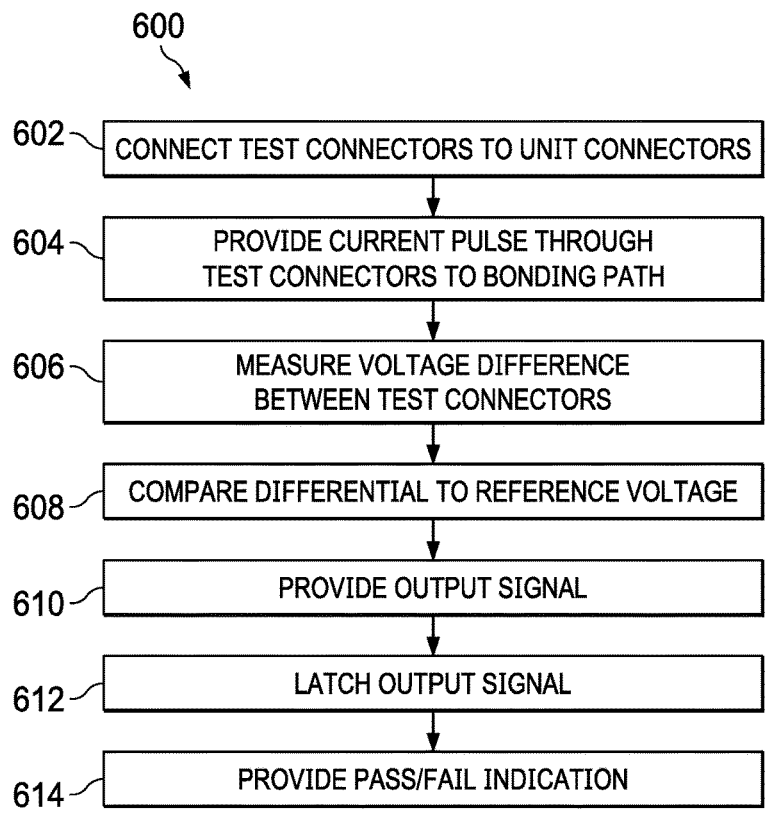
FIG. 6 is a flow diagram illustrating a method of performing bonding testing according to some embodiments.

FIG. 6 is a flow diagram illustrating a method 600 of performing bonding testing according to some embodiments. In some embodiments, the method is initiated in block 602 by connecting test connectors to respective unit connectors. In some embodiments, test system cable connectors for cables attached to system connectors are connected to two different units that are associated with, or electrically connected by, a conductive shelf. Connecting the test system cable connectors to the unit connectors provides a conductive signal path from the test system through the bonding path by way of the unit connectors. In particular, the test connectors may have connector shells that are electrically connected to unit connector shells of the unit connectors, and provide a conductive signal path from the test system through the unit connector shells, which are electrically connected to unit chassis of the respective units.

In block 604, a current pulse is provided through the test connectors to the bonding path. In some embodiments, the bonding test system provides a current pulse through a first connector shell of a first test system connector to a second connector shell of a second test system connector.

In block 606, a voltage difference is measured between the test connectors. In some embodiments, a differential voltage is measured or determined between the test connectors by determining a differential voltage at the test connector shells. The differential voltage is determined, during the current pulse, between a first voltage at the first connector shell and a second voltage the second connector shell, and the differential voltage indicates a resistance in the bonding path. In some embodiments, the differential voltage is a voltage drop across a bonding path between the first unit connector shell, through the first unit, through the second unit, and through the second unit connector shell. In some embodiments, the bonding path is an electrical path from the first unit connector shell to the second unit connector shell and that passes from the first unit connector shell through a first chassis of the first unit to a conductive shelf on which the first unit and the second unit are mounted, through the conductive shelf, and through a second chassis of the second unit to the second connector shell.

In block 608, the differential voltage is compared to a reference voltage. In some embodiments, the voltage differential may be amplified, for example, by an amplifier, to generate a differential voltage signal, which may be compared to the reference voltage, by, for example, a comparator.

In block 610, an output signal is provided. In some embodiments, an output signal such as a comparison signal is generated by, for example, the comparator, according to the comparison of the differential voltage signal to the reference voltage. In block 612, the output signal is latched. In some embodiments, a latch stores or latches the output or comparison signal, and provides a latched output or comparison signal by outputting at least one of the pass indication or the fail indication according to the latched comparison or output signal.

In block 614, a pass or fail indication is provided to a user according the differential voltage, the differential voltage signal, or the comparison signal. The pass or fail indication may be a pass signal or a fail signal. The latch may output, according to the latched output or comparison signal, a fail signal at a first output of the latch to provide the fail indication, such as an illuminated fail light, at a fail indicator such as a fail lamp connected to the latch. The latch may also output, according to the latched comparison signal, a pass signal at a second output of the latch to provide the pass indication, such as an illuminated pass light, at a pass indicator such as a pass light connected to the latch. In some embodiments, the fail signal is generated in response to the comparison signal indicating that the differential voltage signal exceeds the reference voltage, and the pass signal is generated in response to the comparison signal indicating that the reference voltage exceeds the differential voltage signal.

An embodiment device includes a current pulse source, a first connector having a first connector shell connected to the current pulse source, a second connector having a second connector shell, an amplifier electrically connected to the first connector shell and the second connector shell, and a comparator connected to an output of the amplifier.

In some embodiments, the device further includes a storage element having a first input connected to an output of the comparator and a second input connected to a reset switch. In some embodiments, the storage element is a latch, and the latch has a first output connected to a first indicator light and a second output connected to a second indicator light. In some embodiments, a first input of the comparator is connected to the output of the amplifier, and a second input of the comparator is connected to a reference voltage element. In some embodiments, the amplifier is a differential amplifier including an operational amplifier. In some embodiments, the current pulse source is a capacitor, and the device further includes a switching transistor 414 having a conduction path connected between the capacitor and the first connector, and a test switch connected to a gate of the switching transistor.

An embodiment method includes providing, by a bonding test system, a current pulse through a first connector shell of a first test system connector to a second connector shell of a second test system connector, determining, during the current pulse, a differential voltage between a first voltage at the first connector shell and a second voltage the second connector shell, generating a differential voltage signal indicating the differential voltage, and providing at least one of a pass indication or a fail indication according to the differential voltage signal.

In some embodiments, the method further includes connecting the first test system connector to a first unit connector of a first unit with the first connector shell electrically connected to a first unit connector shell of the first unit connector, and connecting the second test system connector to a second unit connector of a second unit with the second connector shell electrically connected to a second unit connector shell of the second unit connector, where the differential voltage is a voltage drop across a bonding path between the first unit connector shell, through the first unit, through the second unit, and through the second unit connector shell. In some embodiments, the bonding path is an electrical path from the first unit connector shell to the second unit connector shell and that passes from the first unit connector shell through a first chassis of the first unit to a conductive shelf on which the first unit and the second unit are mounted, through the conductive shelf, and through a second chassis of the second unit to the second connector shell. In some embodiments, the generating the differential voltage signal indicating the differential voltage includes amplifying, using an amplifier, the differential voltage to generate the differential voltage signal, and the method further includes comparing, using a comparator, the differential voltage signal to a reference voltage, and generating a comparison signal according to the comparison of the differential voltage signal to the reference voltage, and the providing the at least one of the pass indication or the fail indication includes providing the at least one of the pass indication or the fail indication according to the comparison signal. In some embodiments, the method further includes latching the comparison signal using a latch and the providing the at least one of the pass indication or the fail indication includes outputting the at least one of the pass indication or the fail indication according to the latched comparison signal. In some embodiments, the method further includes performing at least one of outputting, by the latch, according to the latched comparison signal, a fail signal at a first output of the latch and providing the fail indication at a fail indicator connected to the latch, or outputting, by the latch, according to the latched comparison signal, a pass signal at a second output of the latch and providing the pass indication at a pass indicator connected to the latch. In some embodiments, the outputting the fail signal at the first output includes outputting the fail signal in response to the comparison signal indicating that the differential voltage signal exceeds the reference voltage, and the outputting the pass signal at the second output includes outputting the pass signal in response to the comparison signal indicating that the reference voltage exceeds the differential voltage signal.

An embodiment device includes a test system circuit configured to generate a current pulse for ground bonding testing of subject units, a first test system connector configured to provide an electrical connection between a first unit connector shell of a first unit of the subject units and the test system circuit and to pass the current pulse to the first unit connector shell during the ground bonding testing, and a second test system connector configured to provide an electrical connection between a second unit connector shell of a second unit of the subject units and a first node of the test system circuit, where the test system circuit is configured to generate a comparison signal according to a relation between a differential voltage and a reference voltage, where the differential voltage is a difference, during the ground bonding testing, in a first voltage at the first test system connector and a second voltage at the first node caused by the current pulse, and where the test system circuit is further configured to provide a test output indication according to the comparison signal, the test output indication indicating whether a bonding path through the subject units is a conductive path having a resistance below a resistance threshold.

In some embodiments, the test system circuit further includes an amplifier having a first port electrically connected to the first test system connector and further having a second port connected to the first node, wherein the amplifier is configured to amplify the differential voltage to generate a differential voltage signal, and where the test system circuit is configured to generate the comparison signal according to a relation between the differential voltage signal and the reference voltage. In some embodiments, the test system circuit further includes a comparator connected to an output of the amplifier to receive the differential voltage signal, where the comparator is configured to compare the differential voltage signal to the reference voltage, and where the comparator is further configured to generate the comparison signal according to the comparison of the differential voltage signal to the reference voltage. In some embodiments, the test system circuit further includes a latch connected to an output of the comparator to receive the comparison signal, where the latch is configured to latch the comparison signal, and wherein the test system circuit is configured to provide the test output indication according to the latched comparison signal. In some embodiments, the test system circuit further includes a pass indicator light connected to the latch and a fail indicator light connected to the latch, and where the test system circuit is configured to provide the test output indication according to the latched comparison signal by providing at least one of a pass indication by illuminating the pass indicator light or a fail indication by illuminating the fail indicator light. In some embodiments, the test system circuit is further configured to provide the fail indication in response to the differential voltage signal exceeding the reference voltage, and the test system circuit is further configured to provide the pass indication in response to the reference voltage exceeding the differential voltage signal. In some embodiments, the test system circuit further includes a current pulse source and a switching transistor connected to the current pulse source and configured to control, according to a test switch connected to the switching transistor being used to initiate the ground bonding testing.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A device, comprising:
   a test system circuit configured to generate a current pulse for ground bonding testing of subject units;
   a first test system connector configured to provide an electrical connection between a first unit connector shell of a first unit of the subject units and the test system circuit and to pass the current pulse to the first unit connector shell during the ground bonding testing; and
   a second test system connector configured to provide an electrical connection between a second unit connector shell of a second unit of the subject units and a first node of the test system circuit;
   wherein the test system circuit is configured to generate a comparison signal according to a relation between a differential voltage and a reference voltage, wherein the differential voltage is a difference, during the ground bonding testing, in a first voltage at the first test system connector and a second voltage at the first node caused by the current pulse; and
   wherein the test system circuit is further configured to provide a test output indication according to the comparison signal, the test output indication indicating whether a bonding path through the subject units is a conductive path having a resistance below a resistance threshold.

2. The device according to claim 1, wherein the test system circuit further comprises an amplifier having a first port electrically connected to the first test system connector and further having a second port connected to the first node, wherein the amplifier is configured to amplify the differential voltage to generate a differential voltage signal; and
   wherein the test system circuit is configured to generate the comparison signal according to a relation between the differential voltage signal and the reference voltage.

3. The device according to claim 2, wherein the test system circuit further comprises a comparator connected to an output of the amplifier to receive the differential voltage signal, wherein the comparator is configured to compare the differential voltage signal to the reference voltage, and wherein the comparator is further configured to generate the comparison signal according to the comparison of the differential voltage signal to the reference voltage.

4. The device according to claim 3, wherein the test system circuit further comprises a latch connected to an output of the comparator to receive the comparison signal, wherein the latch is configured to latch the comparison signal; and wherein the test system circuit is configured to provide the test output indication according to the latched comparison signal.

5. The device according to claim 4, wherein the test system circuit further comprises a pass indicator light connected to the latch and further comprises a fail indicator light connected to the latch, and wherein the test system circuit is configured to provide the test output indication according to the latched comparison signal by providing at least one of a pass indication by illuminating the pass indicator light or a fail indication by illuminating the fail indicator light.

6. The device according to claim 5, wherein the test system circuit is further configured to provide the fail indication in response to the differential voltage signal exceeding the reference voltage; and wherein the test system circuit is further configured to provide the pass indication in response to the reference voltage exceeding the differential voltage signal.

7. The device according to claim 1, wherein the test system circuit further comprises:

a current pulse source; and a switching transistor connected to the current pulse source and configured to control, according to a test switch connected to the switching transistor being used to initiate the ground bonding testing.

* * * * *